United States Patent
Ohno et al.

(10) Patent No.: US 9,881,784 B2
(45) Date of Patent: Jan. 30, 2018

(54) SUBSTRATE PROCESSING METHOD, SUBSTRATE PROCESSING APPARATUS, AND STORAGE MEDIUM

(71) Applicant: Tokyo Electron Limited, Tokyo (JP)

(72) Inventors: Hiroki Ohno, Kumamoto (JP); Keiji Tanouchi, Yamanashi (JP); Kazuyuki Mitsuoka, Kumamoto (JP); Takehiko Orii, Yamanashi (JP); Takayuki Toshima, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/882,790

(22) Filed: Oct. 14, 2015

(65) Prior Publication Data

US 2016/0118242 A1 Apr. 28, 2016

(30) Foreign Application Priority Data

Oct. 24, 2014 (JP) ................................ 2014-217707

(51) Int. Cl.
*H01L 21/02* (2006.01)
*H01L 21/67* (2006.01)

(52) U.S. Cl.
CPC .. *H01L 21/02057* (2013.01); *H01L 21/02101* (2013.01); *H01L 21/67017* (2013.01); *H01L 21/6719* (2013.01); *H01L 21/67028* (2013.01); *H01L 21/67051* (2013.01); *H01L 21/67109* (2013.01); *H01L 21/67207* (2013.01); *H01L 21/67248* (2013.01)

(58) Field of Classification Search
CPC ......... H01L 21/02057; H01L 21/67051; H01L 21/02101; H01L 21/67207; H01L 21/67703; B08B 3/08
See application file for complete search history.

(56) References Cited

U.S. PATENT DOCUMENTS

2002/0184788 A1* 12/2002 Kawakami ................ G03F 7/40
 34/282
2009/0014033 A1* 1/2009 Tokuno ............. H01L 21/02052
 134/18
2011/0214694 A1* 9/2011 Toshima ................... B08B 5/00
 134/21
2012/0234356 A1* 9/2012 Nishi ................ H01L 21/02052
 134/21

FOREIGN PATENT DOCUMENTS

JP 2011-187570 A 9/2011
JP 2013-206957 A 10/2013

* cited by examiner

*Primary Examiner* — Michael Kornakov
*Assistant Examiner* — Natasha Campbell
(74) *Attorney, Agent, or Firm* — Abelman, Frayne & Schwab

(57) ABSTRACT

Disclosed is a substrate processing method. The method includes: supplying a rinse liquid, IPA, a first fluorine-containing organic solvent, a second fluorine-containing organic solvent to a wafer within an outer chamber of a liquid processing unit; conveying the wafer to a supercritical processing unit container; and supplying a supercritical processing fluorine-containing organic solvent in a super-critical high-pressure fluid state to the wafer within the supercritical processing unit container. At least during the supply of the IPA, a low-humidity $N_2$ gas is supplied into the outer chamber so that the inside of the outer chamber is formed as a low-humidity $N_2$ gas atmosphere, and thus moisture absorption into the IPA is prevented.

12 Claims, 10 Drawing Sheets

FIG.8

|  | Temperature (%) | Collapse Result |
|---|---|---|
| FFU<br>IPA 1min | >35 | × |
| N₂ 400 L/min<br>IPA 1min | >15 | ○ |
| N₂<br>650 L/min<br>IPA 1min | <1 | ○ |
| N₂<br>650 L/min<br>IPA 5min | <1 | ◎ |
| FFU<br>IPA 5min<br>(Reference) | >35 | × |

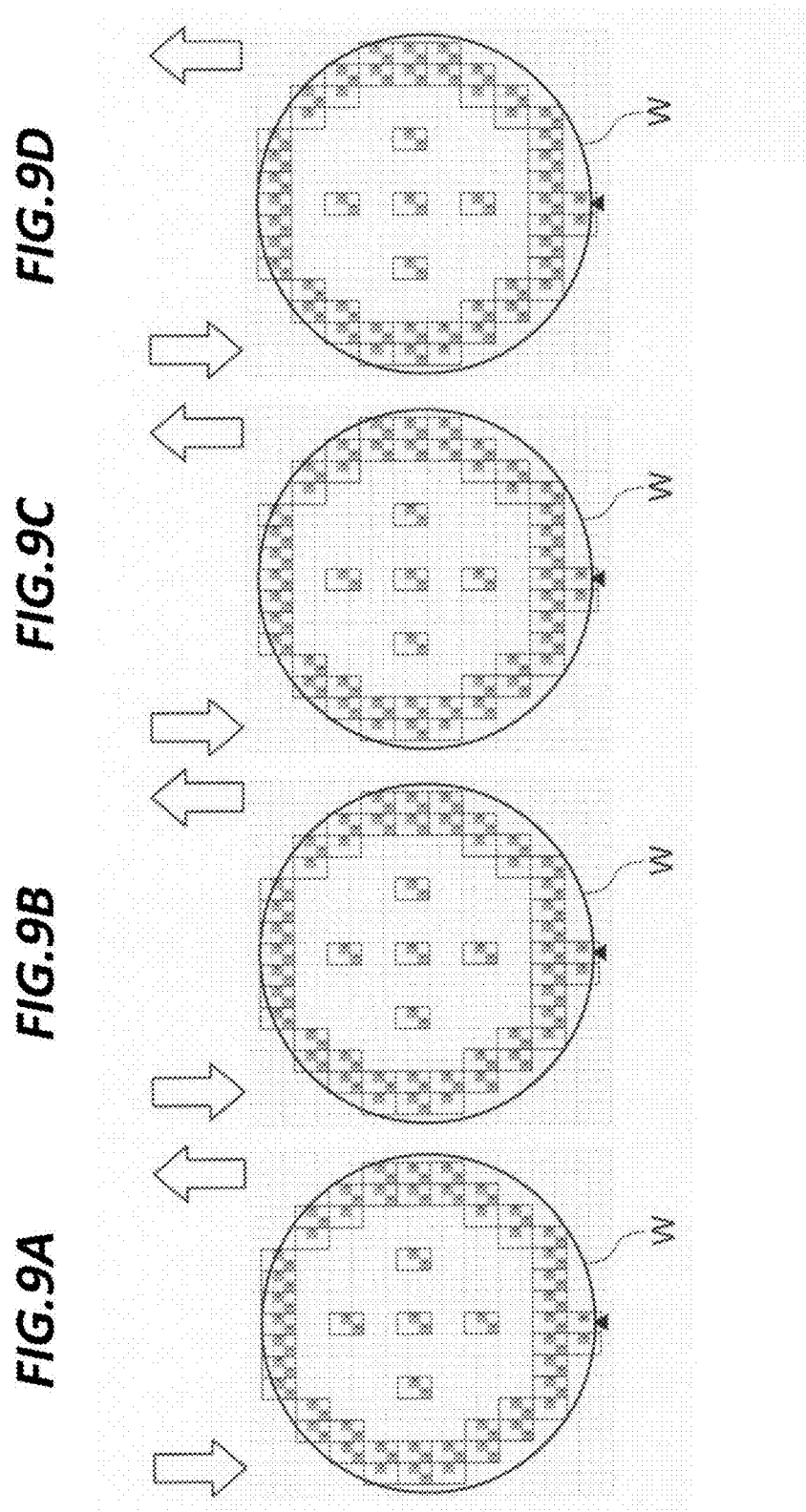

SUBSTRATE PROCESSING METHOD, SUBSTRATE PROCESSING APPARATUS, AND STORAGE MEDIUM

CROSS-REFERENCE TO RELATED APPLICATIONS

This application is based on and claims priority from Japanese Patent Application No. 2014-217707, filed on Oct. 24, 2014, with the Japan Patent Office, the disclosure of which is incorporated herein in its entirety by reference.

TECHNICAL FIELD

The present disclosure relates to a substrate processing method, a substrate processing apparatus, and a storage medium which are used when removing liquid attached to a surface of a substrate using a supercritical high-pressure fluid.

BACKGROUND

In a semiconductor device manufacturing process for forming a lamination structure of an integrated circuit on a surface of, for example, a semiconductor wafer (hereinafter, referred to as a "wafer") that is a substrate, there is a liquid processing process for processing a surface of the wafer using a liquid, such as, for example, removing fine dust or a natural oxide film from the surface of the wafer by a cleaning liquid such as, for example, a chemical liquid.

According to high integration of semiconductor devices, however, a phenomenon, so-called a pattern collapse, becomes a problem when removing, for example, liquid attached to a surface of a wafer in such a liquid processing process.

The pattern collapse refers to a phenomenon in which, when liquid remaining on a surface of a wafer is dried, the liquid remaining in an uneven area forming a pattern, for example, the liquid remaining on the left and right of a convex portion (in other words, in concave portions) is unevenly dried so that the balance of surface tension that draws the convex portion to the left and right is lost and thus the convex portion falls over to the direction where more liquid remains.

As a method of removing liquid attached to a surface of a wafer while suppressing the occurrence of such a pattern collapse, a method of using a supercritical high-pressure fluid is known. The supercritical high-pressure fluid has a low viscosity compared to a liquid, and also has a high performance of extracting the liquid. Further, no interface exists between the supercritical high-pressure fluid and a liquid or gas in an equilibrium state. Thus, when the liquid attached to the surface of the wafer is substituted with the supercritical high-pressure fluid and then the supercritical high-pressure fluid is changed into a gas state, the liquid may be dried without being affected by the surface tension.

For example, in Japanese Patent Laid-Open Publication No. 2011-187570, hydrofluoro ether (HFE)—a fluorine-containing organic solvent (in the Japanese Publication, referred to as a "fluorine compound")—is used for both of a dry preventing liquid and a supercritical high-pressure fluid from the point of view of a substitutability level between the liquid and the supercritical high-pressure fluid or suppression of carry-in of moisture at the time of liquid processing. In addition, the fluorine-containing organic solvent is also suitable for the dry preventing liquid in view of the fact that it is fire-resistant.

However, when the liquid on the surface of the wafer is dried using the supercritical fluid as described above, it is difficult to remove the liquid without causing pattern collapse so that the pattern collapse phenomenon is left in the wafer.

SUMMARY

The present disclosure relates to a substrate processing method. The method includes: supplying a rinse liquid to an object to be processed ("workpiece") placed within a liquid processing unit chamber; supplying IPA to the workpiece placed within the liquid processing unit chamber so as to substitute moisture on the workpiece with the IPA; supplying, within the liquid processing unit chamber, a first fluorine-containing organic solvent to the workpiece so as to substitute the IPA on the workpiece with the first fluorine-containing organic solvent; supplying, within the liquid processing unit chamber, a second fluorine-containing organic solvent to the workpiece so as to substitute the first fluorine-containing organic solvent on the workpiece with the second fluorine-containing organic solvent; conveying the workpiece within the liquid processing unit chamber to a supercritical processing unit container; and supplying, within the supercritical processing unit container, a supercritical processing fluorine-containing organic solvent to the workpiece. A low-humidity gas is supplied into the liquid processing unit chamber at least during the supply of the IPA.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 8 is a view illustrating a result of collapse in the present exemplary embodiment.

FIGS. 9A to 9D are plan views of wafers, each illustrating a result of collapse in the present exemplary embodiment.

DETAILED DESCRIPTION

Figure 1:
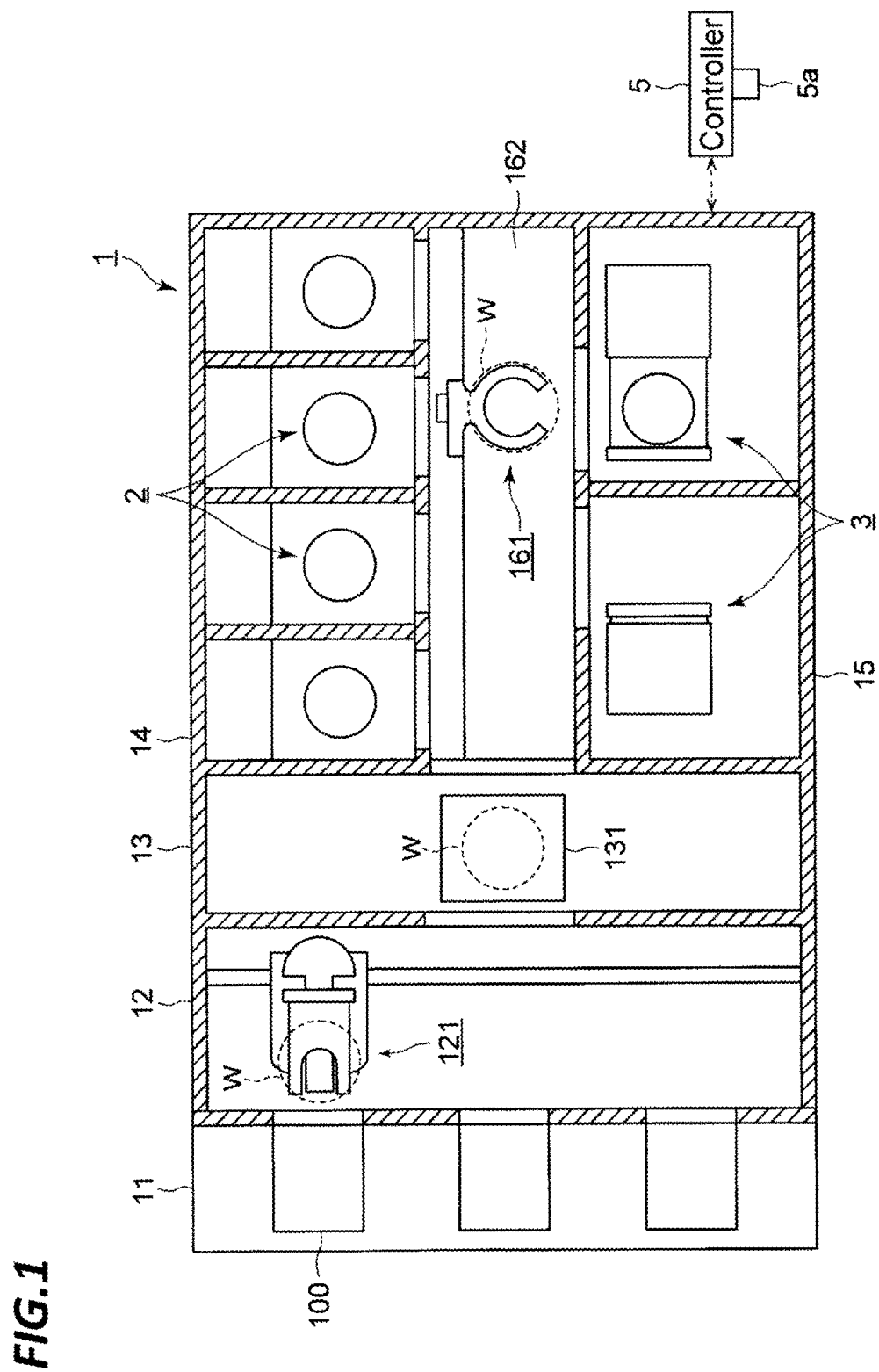
FIG. 1 is a horizontal sectional plan view illustrating a liquid processing apparatus.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure is to provide a substrate processing method, a substrate processing apparatus, and a storage medium in which a processing is performed using a fluorine-containing organic solvent in order to remove liquid attached to a surface of a wafer, and the liquid attached to the surface of the wafer is removed by a supercritical processing to be capable of preventing pattern collapse on the wafer.

An aspect of the present disclosure relates to a substrate processing method. The substrate processing method includes: supplying a rinse liquid to a workpiece placed within a liquid processing unit chamber; supplying IPA to the workpiece placed within the liquid processing unit chamber so as to substitute moisture on the workpiece with the IPA; supplying, within the liquid processing unit chamber, a first fluorine-containing organic solvent to the workpiece so as to substitute the IPA on the workpiece with the first fluorine-containing organic solvent; supplying, within the liquid processing unit chamber, a second fluorine-containing organic solvent to the workpiece so as to substitute the first fluorine-containing organic solvent on the workpiece with the second fluorine-containing organic solvent; conveying the workpiece within the liquid processing unit chamber to a supercritical processing unit container; and supplying, within the supercritical processing unit container, a supercritical processing fluorine-containing organic solvent to the workpiece. A low-humidity gas is supplied into the liquid processing unit chamber at least during the supply of the IPA.

In the substrate processing method described above, a low-humidity inert gas is supplied into the liquid processing unit chamber.

In the substrate processing method described above, air having a dew point of −70° C. or less is supplied into the liquid processing unit chamber.

In the substrate processing method described above, the low-humidity gas is supplied into the liquid processing unit chamber so as to set a humidity within the liquid processing unit chamber to 3% or less.

In the substrate processing method described above, the low-humidity gas is supplied into the liquid processing unit chamber during the supply of the first fluorine-containing organic solvent, or during the supply of the first fluorine-containing organic solvent and during the supply of the second fluorine-containing organic solvent.

In the substrate processing method described above, when conveying the workpiece within the liquid processing unit chamber to the supercritical processing unit container, the workpiece is conveyed in a state where a surface of the workpiece is covered with the second fluorine-containing organic solvent.

Another aspect of the present disclosure relates to a substrate processing apparatus. The substrate processing apparatus includes a liquid processing unit, a supercritical processing unit, and a conveyance mechanism. The liquid processing unit includes: a liquid processing unit chamber configured to accommodate a workpiece, a rinse liquid supply unit configured to supply a rinse liquid to the workpiece within the liquid processing unit chamber, an IPA supply unit configured to supply IPA to the workpiece within the liquid processing unit chamber, a first fluorine-containing organic solvent supply unit configured to supply a first fluorine-containing organic solvent to the workpiece within the liquid processing unit chamber, and a second fluorine-containing organic solvent supply unit configured to supply a second fluorine-containing organic solvent to the workpiece within the liquid processing unit chamber. The supercritical processing unit includes: a supercritical processing unit container configured to accommodate the workpiece, and a supercritical processing fluorine-containing organic solvent supply unit configured to supply a supercritical processing fluorine-containing organic solvent into the supercritical processing unit container. The conveyance mechanism is configured to convey the workpiece within the liquid processing unit chamber to the supercritical processing unit container. A low-humidity gas supply unit configured to supply a low-humidity gas is provided in the liquid processing unit chamber, and at least during the supply of the IPA, the low-humidity gas supply unit is operated by a controller so as to supply the low-humidity gas into the liquid processing unit chamber.

In the substrate processing apparatus described above, an FFU configured to supply clean air is provided in the liquid processing unit chamber. During the supply of the first fluorine-containing organic solvent and during the supply of the second fluorine-containing organic solvent, the low-humidity gas supply unit is operated by the controller so as to supply the low-humidity gas to the workpiece within the liquid processing unit chamber.

Still another aspect of the present disclosure relates to a non-transitory computer-readable recoding medium storing a computable executable program. When executed, the program causes a computer to perform a substrate processing method that includes: supplying a rinse liquid to a workpiece placed within a liquid processing unit chamber; supplying IPA to the workpiece placed within the liquid processing unit chamber so as to substitute moisture on the workpiece with the IPA; supplying, within the liquid processing unit chamber, a first fluorine-containing organic solvent to the workpiece so as to substitute the IPA on the workpiece with the first fluorine-containing organic solvent; supplying, within the liquid processing unit chamber, a second fluorine-containing organic solvent to the workpiece so as to substitute the first fluorine-containing organic solvent on the workpiece with the second fluorine-containing organic solvent; conveying the workpiece within the liquid processing unit chamber to a supercritical processing unit container; and supplying, within the supercritical processing unit container, a supercritical processing fluorine-containing organic solvent to the workpiece. A low-humidity gas is supplied into the liquid processing unit chamber at least during the supply of the IPA.

According to the aspects of the present disclosure, it is possible to remove liquid attached to a surface of a wafer by a supercritical processing using a fluorine-containing organic solvent.

<Substrate Processing Apparatus>

First, descriptions will be made on a substrate processing apparatus that includes therein a separation and reproducing apparatus according to the present disclosure will be described. As an example of the substrate processing apparatus, descriptions will be made on a liquid processing apparatus 1 that includes liquid processing units 2 configured to perform a liquid processing by supplying various processing liquids to a wafer W as a substrate (an object to be processed), and supercritical processing units 3 (high-pressure fluid processing units) configured to remove a dry preventing liquid attached to the wafer W after the liquid processing by causing the dry preventing liquid to be in contact with a supercritical fluid (supercritical high-pressure fluid).

FIG. 1 is a horizontal sectional plan view illustrating an overall configuration of the liquid processing apparatus 1. The left side when viewing the drawing is assumed as the front. In the liquid processing apparatus 1, FOUPs 100 are placed in a placement section 11, and a plurality of, for example, 300 mm wafers W stored in each FOUP 100 are delivered between a liquid processing section 14 and a supercritical processing section 15 at the rear end through a carry-in/out section 12 or a delivery section 13, sequentially carried into liquid processing units 2 and supercritical processing units 3 so that a liquid processing or a processing of removing a dry preventing liquid is performed thereon. In the drawing, reference numeral 121 indicates a first conveyance mechanism that conveys the wafers W between the FOUP 100 and the delivery section 13, and reference numeral 131 indicates a delivery rack serving as a buffer on which the wafers W, conveyed between the carry-in/out section 12 and the liquid processing section 14 and the supercritical processing section 15, are temporarily placed.

The liquid processing section 14 and the supercritical processing section 15 are provided with a wafer W conveyance space 162 being interposed therebetween. The conveyance space 162 extends from an opening between the conveyance space 162 and the delivery section 13 in the longitudinal direction. In the liquid processing section 14 provided on the left of the conveyance space 162 when viewed from the front side, for example, four liquid processing units 2 are arranged along the conveyance space 162. Meanwhile, in the supercritical processing section 15 provided on the right of the conveyance space 162, for example, two supercritical processing units 3 are arranged along the conveyance space 162.

The wafers W are conveyed among each of the liquid processing units 2, each of the supercritical processing units 3, and the delivery section 13 by a second conveyance mechanism 161 placed in the conveyance space 162. The second conveyance mechanism 161 corresponds to a substrate conveyance unit. Here, the number of liquid processing units 2 arranged in the liquid processing section 14 or the number of supercritical processing units 3 arranged in the supercritical processing section 15 is properly selected in consideration of, for example, the number of wafers W to be processed per unit time, and a difference in processing time between the liquid processing units 2 and the supercritical processing units 3, and an optimal layout is selected according to, for example, the arranged number of the liquid processing units 2 or the supercritical processing units 3.

Each liquid processing unit 2 is configured as a single wafer liquid processing unit 2 that cleans the wafers W one by one, for example, by a spin cleaning. As illustrated in the vertical sectional view of FIG. 2, the liquid processing unit 2 includes: an outer chamber 21 serving as a liquid processing unit chamber that defines a processing space; a wafer holding mechanism 23 placed within the outer chamber, and configured to rotate a wafer W around a vertical axis while holding the wafer W substantially horizontally; an inner cup 22 arranged to enclose the wafer holding mechanism 23 at the lateral peripheral side thereof, and configured to receive the liquid scattered from the wafer W; and a nozzle arm 24 configured to be movable between a position above the wafer W and a position retreated from the position above the wafer W, and provided with a nozzle 241 at the front end thereof.

A processing liquid supply unit 201 that supplies various chemical liquids, a rinse liquid supply unit 202 that supplies a rinse liquid, a first fluorine-containing organic solvent supply unit 203a (a first fluorine-containing organic solvent supply unit) that supplies a first fluorine-containing organic solvent—a dry preventing liquid—to a surface of the wafer W, and a second fluorine-containing organic solvent supply unit 203b (a second fluorine-containing organic solvent supply unit) that supplies a second fluorine-containing organic solvent are connected to the nozzle 241. The first and second fluorine-containing organic solvents used here are different from a fluorine-containing organic solvent for a supercritical processing which is used for a supercritical processing to be described later, and the first fluorine-containing organic solvent, the second fluorine-containing organic solvent, and the fluorine-containing organic solvent for a supercritical processing, which have a predetermined relationship in terms of boiling points or critical temperatures thereof, are used, which will be described in detail below.

In addition, the outer chamber 21 is provided with a fan filter unit (FFU) 205, and air cleaned from the FFU 205 is supplied into the outer chamber 21. In addition, the outer chamber 21 is provided with a low-humidity $N_2$ gas supply unit 206, and a low-humidity $N_2$ gas is supplied from the low-humidity $N_2$ gas supply unit 206 into the outer chamber 21.

In addition, a chemical liquid supply path 231 may also be formed in the wafer holding mechanism 23, and a rear surface cleaning of the wafer W may be performed using the chemical liquid and the rinse liquid supplied from the chemical liquid supply path 231. An exhaust port 212 for exhausting the inner atmosphere or liquid exhaust ports 221, 211 for exhausting liquid scattered from the wafer W are provided in the bottom portion of the outer chamber 21 or the inner cup 22.

A first fluorine-containing organic solvent and a second fluorine-containing organic solvent for dry prevention are supplied to the wafer W for which the liquid processing by the liquid processing unit 2 has been completed, and the wafer W is conveyed to the supercritical processing unit 3 by the second conveyance mechanism 161 in a state where the surface of the wafer W is covered with the second fluorine-containing organic solvent. In the supercritical processing unit 3, the wafer W is caused to come in contact with a supercritical fluid of a supercritical processing fluorine-containing organic solvent so as to remove the second fluorine-containing organic solvent, and a processing for drying the wafer W is performed. Hereinafter, the configuration of the supercritical processing unit 3 will be described with reference to FIGS. 3 and 4.

The supercritical processing unit 3 includes a processing container 3A serving as a supercritical processing unit container in which a processing of removing a dry preventing liquid (the second fluorine-containing organic solvent) attached to the surface of the wafer W is performed, and a supercritical fluid supply unit 4A (a supercritical processing fluorine-containing organic solvent supply unit) that supplies a supercritical fluid of a supercritical processing fluorine-containing organic solvent to the processing container 3A.

Figure 4:
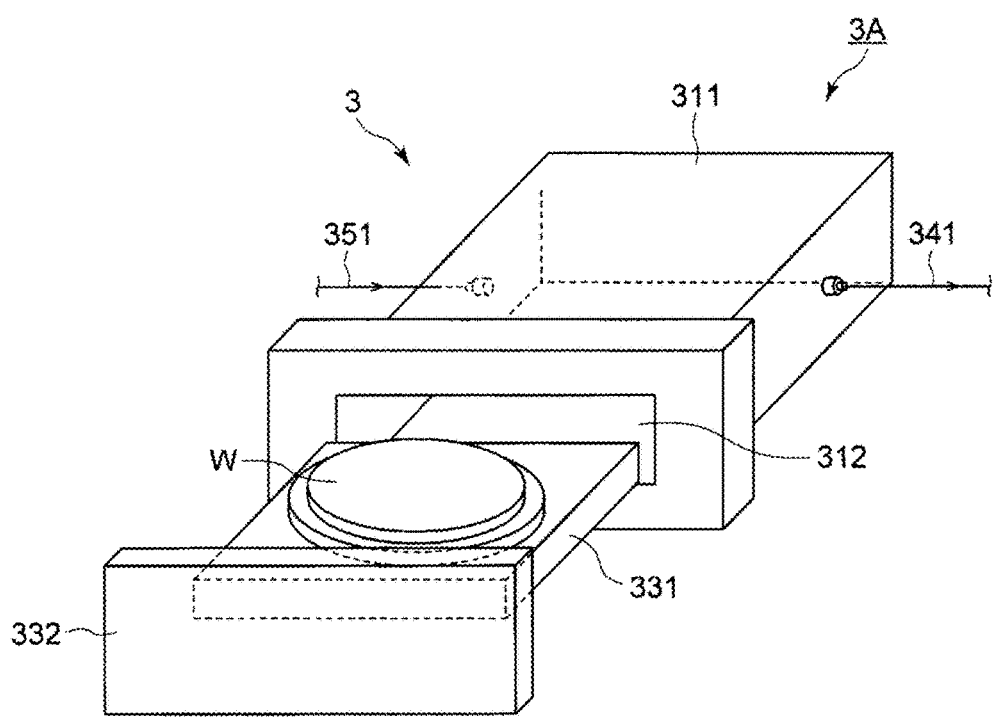
FIG. 4 is a perspective view illustrating an external appearance of a processing container of the supercritical processing unit.

As illustrated in FIG. 4, the processing container 3A includes a case type container body 311 in which a wafer W carry-in/out opening 312 is formed, a wafer tray 331 configured to hold a wafer W to be processed in a horizontal direction, and a cover member 332 configured to support the wafer tray 331 and to seal the opening 312 when the wafer W is carried into the container body 311.

The container body 311 is a container in which a processing space of about 200 to 10,000 $cm^3$ is formed to be capable of accommodating, for example, a 300 mm wafer W.

A supercritical fluid supply line 351 configured to supply a supercritical fluid into the processing container 3A and a discharge line 341 (a discharge section) are connected to the top surface of the container body 311. An opening/closing valve 342 configured to discharge the fluid within the processing container 3A is mounted in the middle of the discharge line 341. In addition, the processing container 3A is provided with a pressing mechanism (not illustrated) that is configured to press the cover member 332 toward the container body 311 against the inner pressure received from the supercritical processing fluid supplied into the processing space so as to seal the processing space.

The container body 311 is provided with, for example, a heater 322 which is a heating unit formed of, for example, a resistance heating element, and a temperature detection unit 323 including, for example, a thermocouple for detecting the temperature within the processing container 3A. By heating the container body 311, the inside of the processing container 3A is heated to a pre-set temperature, and as a result, the wafer W therein may be heated. The heater 322 is variable in caloric value by changing the power fed from the power feed unit 321, and adjusts the temperature within the processing container 3A to a pre-set temperature based on a temperature detection result acquired from the temperature detection unit 323.

The supercritical fluid supply unit 4A is connected to the upstream side of the supercritical fluid supply line 351 in the midway of which an opening/closing valve 352 is mounted. The supercritical fluid supply unit 4A includes a spiral pipe 411 which is a pipe configured to prepare a supercritical fluid of a supercritical processing fluorine-containing organic solvent which is supplied to the processing container 3A, a supercritical processing fluorine-containing organic solvent supply unit 414 configured to supply the liquid of the supercritical processing fluorine-containing organic solvent which is a raw material of the supercritical fluid to the spiral pipe 411, and a halogen lamp 413 configured to heat the spiral pipe 411 so as to turn the supercritical processing fluorine-containing organic solvent within the spiral pipe 411 into the supercritical state.

The spiral pipe 411 is a cylindrical container formed by winding, for example, a stainless steel-made pipe member spirally in the longitudinal direction, and is painted with, for example, a black radiation heat absorbing paint in order to facilitate the absorption of the radiation heat supplied from the halogen lamp 413. The halogen lamp 413 is disposed along the central axis of the cylinder of the spiral pipe 411 to be spaced apart from the inner wall surface of the spiral pipe 411.

A power supply 412 is connected to the lower end of the halogen lamp 413, and the halogen lamp 413 generates heat by the power supplied from the power supply 412 so that the spiral pipe 411 is mainly heated using the radiation heat of the halogen lamp 413. The power supply 412 is connected with a temperature detection unit (not illustrated) provided in the spiral pipe 411 so that the power supplied to the spiral pipe 411 increases or decrease based on a detected temperature and the inside of the spiral pipe 411 may be heated to a pre-set temperature.

In addition, a pipe member extends from the lower end of the spiral pipe 411 to form an accommodation line 415 of the supercritical processing fluorine-containing organic solvent. The accommodation line 415 is connected to the supercritical processing fluorine-containing organic solvent supply unit 414 via an opening/closing valve 416 having a pressure resistant strength. The supercritical processing fluorine-containing organic solvent supply unit 414 includes, for example, a tank configured to store the supercritical processing fluorine-containing organic solvent in the liquid state, a liquid feeding pump, and a flow rate adjusting mechanism.

Figure 2:
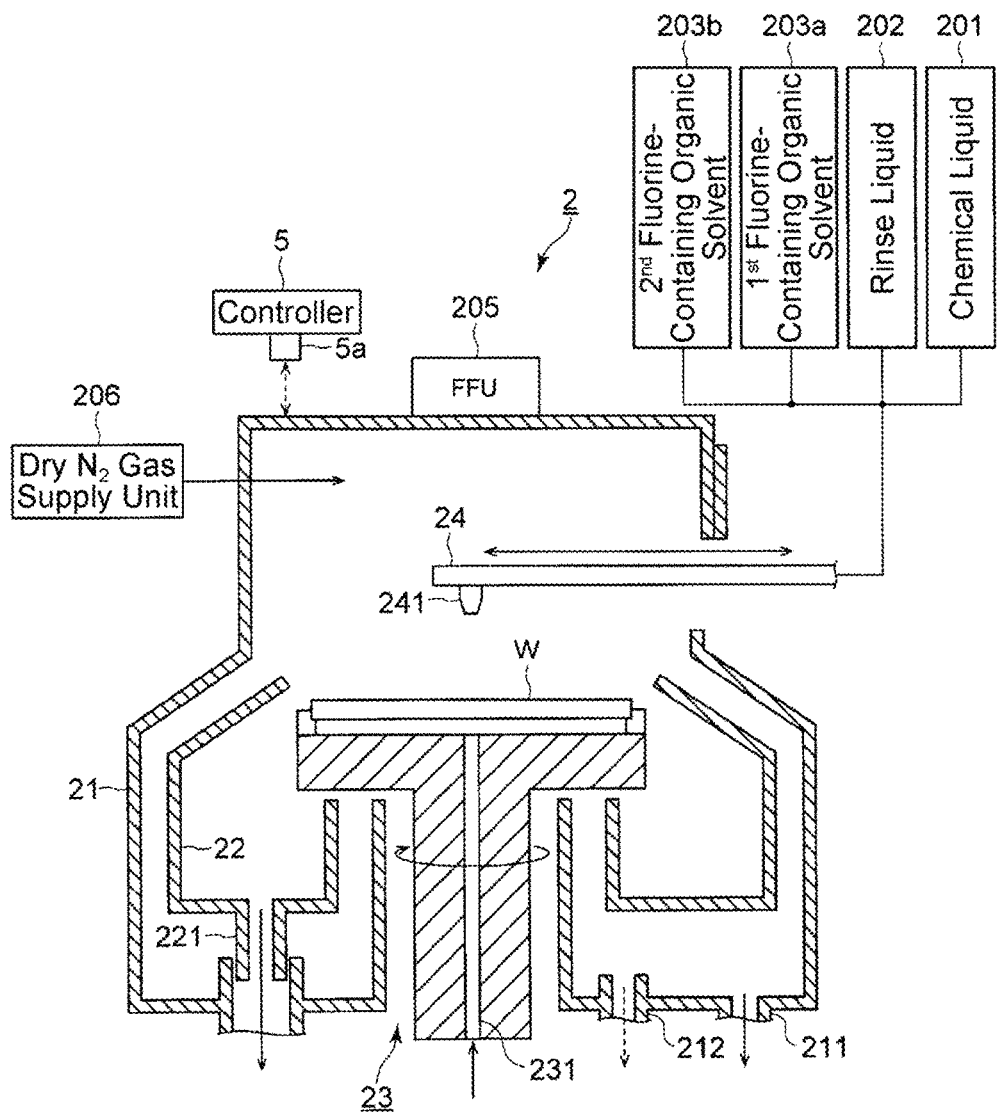
FIG. 2 is a vertical sectional view illustrating a liquid processing unit provided in the liquid processing apparatus.
Figure 3:
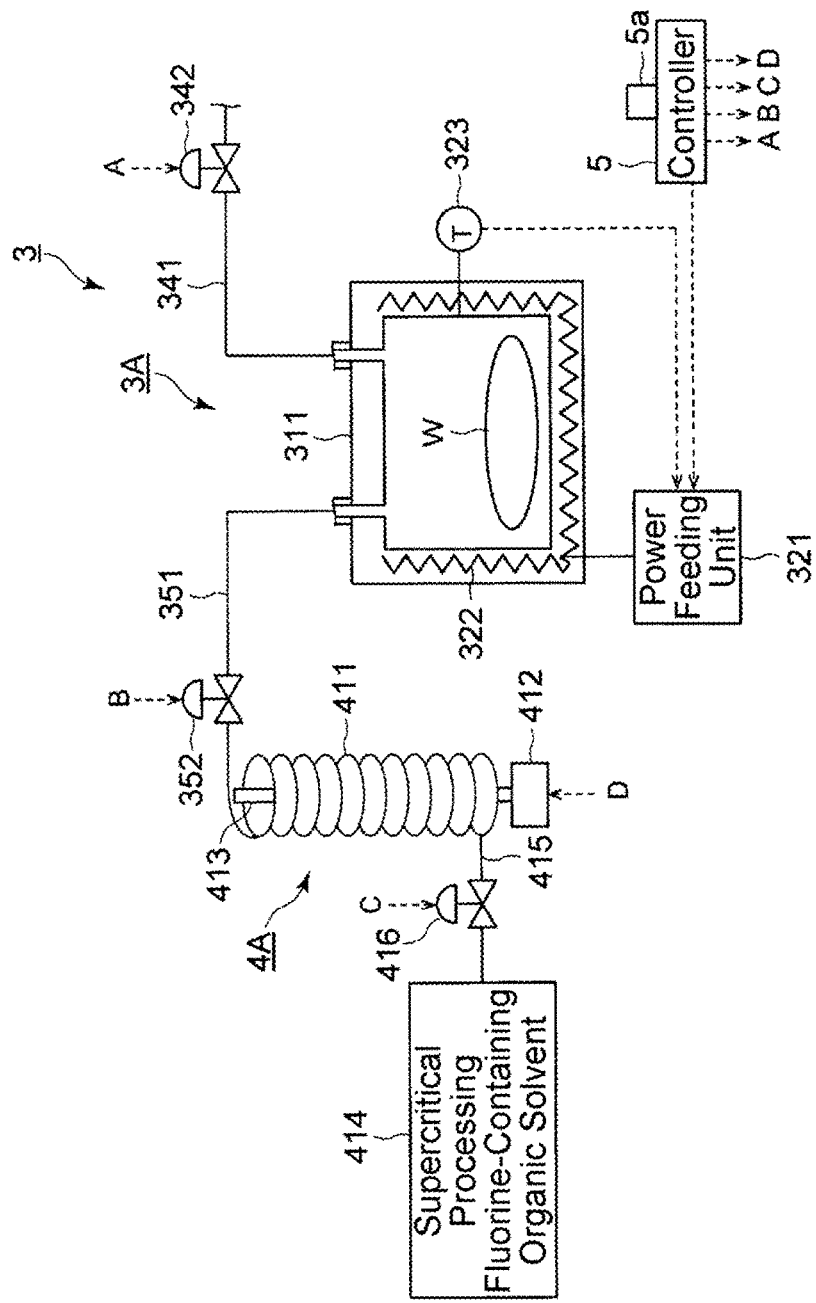
FIG. 3 is a view illustrating a configuration of a supercritical processing unit provided in the liquid processing apparatus.

The liquid processing apparatus 1 that includes the liquid processing unit 2 and the supercritical processing unit 3 which are configured as described above is connected to a controller 5, as illustrated in FIGS. 1 to 3. The controller 5 is formed of a computer that includes a CPU (not illustrated) and a storage unit 5a. In the storage unit 5a, a program is recorded in which a group of steps (commands) of performing controls related to the operations of the liquid processing apparatus 1, i.e., the operations of taking out a wafer W from a FOUP 100, performing a liquid processing on the wafer W in a liquid processing unit 2, subsequently performing a processing for drying the wafer W by a supercritical processing unit 3, and then carrying the wafer W into the FOUP 100, are set up. The program is stored in a storage medium such as, for example, a hard disc, a compact disc, a magneto-optical disc, or a memory card, and installed to the computer from the storage medium.

Next, descriptions will be made on the first fluorine-containing organic solvent and the second fluorine-containing organic solvent which are supplied from the liquid processing unit 2 to the surface of a wafer W, and the supercritical processing fluorine-containing organic solvent that is supplied to the processing container 3A in the supercritical fluid state so as to remove the second fluorine-containing organic solvent from the surface of the wafer W. All of the first fluorine-containing organic solvent, the second fluorine-containing organic solvent, and the supercritical processing fluorine-containing organic solvent are fluorine-containing organic solvents that include fluorine atoms in hydrocarbon molecules.

Examples of combination of the first fluorine-containing organic solvent, the second fluorine-containing organic solvent, and the supercritical processing fluorine-containing organic solvent are represented (Table 1).

TABLE 1

| | Manufacturer | Product Name | Classification Name | Boiling Point (° C.) |
|---|---|---|---|---|
| First Fluorine-Containing Organic Solvent | Asahi Glass Co., Ltd. | AE-3000 | HFE | 56 |
| | Asahi Glass Co., Ltd. | AC-6000 | HFC | 115 |
| | Asahi Glass Co., Ltd. | AC-2000 | HFC | 68 |
| | Sumitomo 3M Ltd. | Novec ™ 7100 | HFE | 61 |
| | Sumitomo 3M Ltd. | Novec ™ 7200 | HFE | 76 |
| | Sumitomo 3M Ltd. | Novec ™ 7300 | HFE | 98 |
| | Sumitomo 3M Ltd. | Novec ™ | HFE | 128 |

TABLE 1-continued

| | Manufacturer | Product Name | Classification Name | Boiling Point (° C.) |
|---|---|---|---|---|
| Second Fluorine-Containing Organic Solvent | Sumitomo 3M Ltd. | Fluorinert ™ 7500 FC-40 | PFC | 165 |
| | Sumitomo 3M Ltd. | Fluorinert ™ FC-43 | PFC | 174 |
| | Sumitomo 3M Ltd. | Fluorinert ™ FC-3283 | PFC | 128 |
| | Solvay Solexis, Inc. | GALDEN ™ HT 200 | PFE | 200 |
| | Solvay Solexis, Inc. | GALDEN ™ | PFE | 170 |
| Supercritical Processing Fluorine-Containing Organic Solvent | Sumitomo 3M Ltd. | Fluorinert ™ FC-72 | PFC | 56 |

In "Classification Name" in Table 1, HFE (HydroFluoro Ether) indicates a fluorine-containing organic solvent in which some hydrogens in a hydrocarbon having an ether bond within a molecule are substituted with fluorine, HFC (HydroFluoro Carbon) indicates a fluorine-containing organic solvent in which some hydrogens in a hydrocarbon are substituted with fluorine. In addition, PFC (PerFluoro Carbon) indicates a fluorine-containing organic solvent in which all the hydrogens in a hydrocarbon are substituted with fluorine, and PFE (PerFluoro Ether) indicates a fluorine-containing organic solvent in which all the hydrogens in a hydrocarbon having an ether bond within a molecule are substituted with fluorine.

When one fluorine-containing organic solvent is selected from these fluorine-containing organic solvents as a supercritical processing fluorine-containing organic solvent, a fluorine-containing organic solvent having a higher boiling point (a lower vapor pressure) than the supercritical processing fluorine-containing organic solvent is selected as the second fluorine-containing organic solvent. According to this, as compared to a case in which the supercritical processing fluorine-containing organic solvent is used as a dry preventing liquid, it is possible to reduce the amount of the fluorine-containing organic solvent liquid to be volatilized from the surface of the wafer W while the wafer W is conveyed from the liquid processing unit 2 to the supercritical processing unit 3.

More suitably, the boiling point of the first fluorine-containing organic solvent may be around 100° C. (e.g., 98° C.), and the boiling point of the second fluorine-containing organic solvent may be 100° C. or higher (e.g., 174° C.) which is higher than the boiling point of the first fluorine-containing organic solvent. The second fluorine-containing organic solvent having the boiling point of 100° C. or higher is less volatilized during the conveyance of the wafer W. Thus, the surface of the wafer W is capable of remaining wet for about dozens of seconds to 10 minutes merely by supplying a small amount of the fluorine-containing organic solvent, for example, about 0.01 cc to 5 cc in the case where the wafer W is, for example, a 300 mm wafer W, or about 0.02 cc to 10 cc in the case where the wafer W is a 450 mm wafer W. For reference, in order to maintain the surface of the wafer W in the wet state for the same length of time with IPA, a supply amount of about 10 cc to 50 cc is needed.

In addition, when two kinds of fluorine-containing organic solvents are selected, the heights of the boiling points thereof also correspond to the height of the supercritical temperatures thereof. Thus, when a supercritical processing fluorine-containing organic solvent used as the supercritical fluid is selected which has a boiling point lower than that of the second fluorine-containing organic solvent, it is possible to use a fluorine-containing organic solvent that is capable of forming a supercritical fluid at a low temperature, and fluorine atoms are suppressed from being emitted by decomposition of the fluorine-containing organic solvent.

<Functional Action of Exemplary Embodiment>

Next, descriptions will be made on the functional actions of the present exemplary embodiment configured as described above.

In the present exemplary embodiment, descriptions will be made on the functional actions in a case where HFE7300 is used as the first fluorine-containing organic solvent, FC43 is used as the second fluorine-containing organic solvent, and FC72 is used as the supercritical processing fluorine-containing organic solvent.

First, a wafer W taken out from a FOUP 100 is carried into the outer chamber 21 of the liquid processing section 14 through the carry-in/out section 12 and the delivery section 13, and delivered to the wafer holding mechanism 23 of the liquid processing unit 2. Subsequently, various processing liquids are supplied to the surface of the rotating wafer W so as to perform liquid processings.

Figure 5:
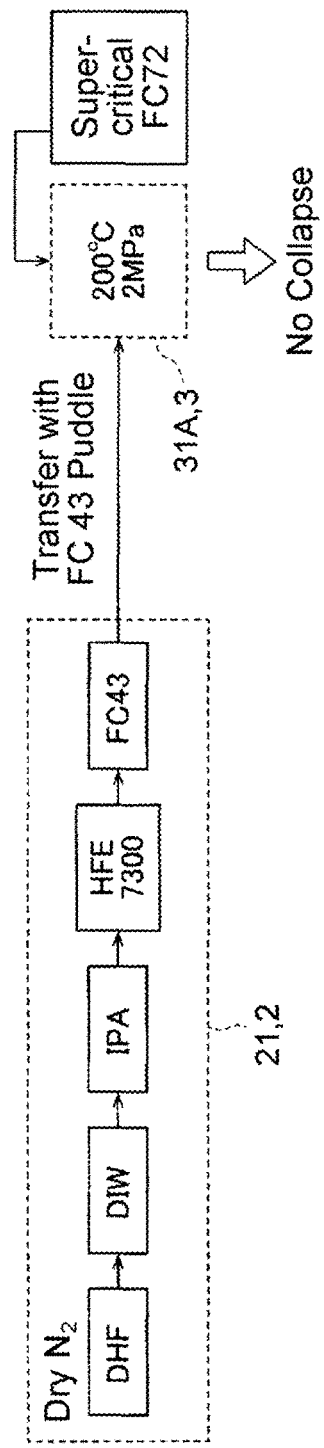
FIG. 5 is a view illustrating an acting sequence of the present exemplary embodiment.

As illustrated in FIG. 5, for example, removal of particles or an organic contaminant material by diluted hydrofluoric acid (DHF) which is an acidic chemical liquid and rinse cleaning by deionized water (DIW) which is a rinse liquid are performed as liquid processings.

When the liquid processing by the chemical liquid or the rinse cleaning is completed, IPA is supplied to the surface of the rotating wafer W from the rinse liquid supply unit 202 (IPA supply unit) so as to substitute the DIW remaining on the front and rear surfaces of the wafer W with the IPA. When the liquid on the front surface of the wafer W is sufficiently substituted with the IPA, the first fluorine-containing organic solvent (HFE7300) is supplied to the front surface of the rotating wafer W from the first fluorine-containing organic solvent supply unit 203a, then the wafer W is continuously rotated, then the second fluorine-containing organic solvent (FC43) is supplied to the front surface of the rotating wafer W from the second fluorine-containing organic solvent supply unit 203b, and then the rotation of the wafer W is stopped. After the rotation is stopped, the wafer W is in the state where its front surface is covered with the second fluorine-containing organic solvent. In this case, since the IPA has high affinity with the DIW and HFE7300, and the HFE7300 has high affinity with the IPA and the FC43, the DIW may be substituted by the IPA, and then the IPA may be substituted by the HFE7300. Next, the HFE7300 may be easily substituted by the FC43.

During this, i.e., during the supply of the DHF, during the supply of the DIW, during the supply of the IPA, during the supply of the first fluorine-containing organic solvent, and during the supply of the second fluorine-containing organic solvent, a low humidity (with a dew point of −70° C. or less) $N_2$ gas is continuously supplied into the outer chamber 21 from the low-humidity $N_2$ gas supply unit 206 so that the inside of the outer chamber 21 is maintained as the low-humidity $N_2$ gas atmosphere. At this time, the humidity within the outer chamber 21 may be 3% or less.

By maintaining the inside of the outer chamber 21 as the low-humidity $N_2$ gas atmosphere as described above, moisture absorption into the IPA can be suppressed so that the pattern collapse of the wafer W can be suppressed during a supercritical processing as described below.

Figure 6:
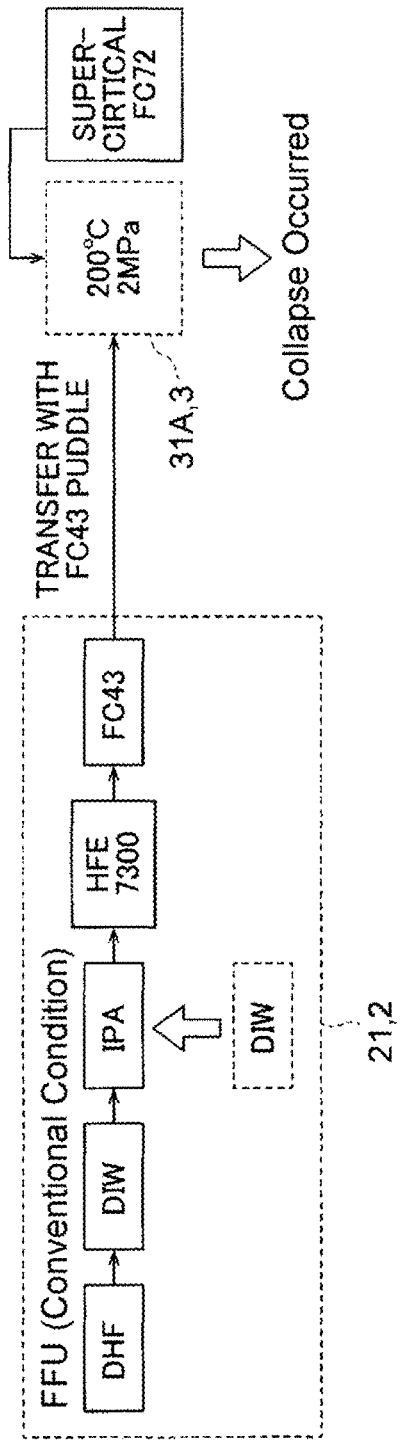
FIG. 6 is a view illustrating an acting sequence as a comparative example.

Meanwhile, the IPA easily absorbs moisture from the atmosphere, and when purified air is supplied into the outer chamber 21 from the FFU (see a comparative example of FIG. 6), the IPA may absorb the moisture in the air. In such a case, the IPA is substituted with the first fluorine-containing organic solvent or the second fluorine-containing organic solvent, but the moisture in the IPA is not substituted with the first fluorine-containing organic solvent or the second fluorine-containing organic solvent. Therefore, moisture remains in the pattern of the wafer. For this reason, it may be considered that pattern collapse in the wafer may occur during the supercritical processing.

Whereas, according to the present exemplary embodiment, by maintaining the inside of the outer chamber 21 as the low-humidity $N_2$ gas atmosphere, the moisture absorption into the IPA can be suppressed so that the pattern collapse in the wafer can be suppressed.

In addition, the exemplary embodiment described above has illustrated an example in which during the supply of the DHF, during the supply of the DIW, during the supply of the IPA, during the supply of the first fluorine-containing organic solvent, and during the supply of the second fluorine-containing organic solvent, a low humidity $N_2$ gas is continuously supplied into the outer chamber 21 from the low-humidity $N_2$ gas supply unit 206. However, without being limited to this, during the supply of the DHF, during the supply of the DIW, during the supply of the first fluorine-containing organic solvent, and during the supply of the second fluorine-containing organic solvent, purified air may be supplied into the outer chamber 21 from the FFU 205 by controlling the FFU 205 by the controller 5 while only during the supply of the IPA, the low-humidity $N_2$ gas may be supplied into the outer chamber 21 from the low-humidity $N_2$ gas supply unit 206 by controlling the low-humidity $N_2$ gas supply unit 206 by the controller 5. Alternatively, during the supply of the IPA and during the supply of the first fluorine-containing organic solvent, or during the supply of the IPA and during the supply of the first fluorine-containing organic solvent and during the supply of the second fluorine-containing organic solvent, the low-humidity $N_2$ gas may be supplied into the outer chamber 21 from the low-humidity $N_2$ gas supply unit 206 by controlling the low-humidity $N_2$ gas supply unit 206 by the controller 5. As a result, the usage of the low-humidity $N_2$ gas supplied into the outer chamber 21 may be reduced.

As illustrated in FIG. 5, after the liquid processing is completed, the wafer W is carried out of the liquid processing unit 2 by the second conveyance mechanism 161, and conveyed to the supercritical processing unit 3. At this time, the second fluorine-containing organic solvent may remain on the wafer W in some cases. However, since a fluorine-containing organic solvent having a high boiling point (a small vapor pressure) is used as the second fluorine-containing organic solvent, the amount of the fluorine-containing organic solvent volatilized from the front surface of the wafer W during the period in which the wafer W is conveyed can be reduced.

In the timing before the wafer W is carried into the processing container 3A, the supercritical fluid supply unit 4A sends a predetermined amount of the liquid of the supercritical processing fluorine-containing organic solvent from the supercritical processing fluorine-containing organic solvent supply unit 414 by opening the opening/closing valve 416, and then places the spiral pipe 411 in a sealed state by closing the opening/closing valves 352, 416. At this time, the liquid of the supercritical processing fluorine-containing organic solvent is stored in the lower side of the spiral pipe 411, and a space remains in the upper side of the spiral pipe 411 so that when the supercritical processing fluorine-containing organic solvent is heated, the vaporized supercritical processing fluorine-containing organic solvent will be expanded to the space.

In addition, when power feeding from the power supply 412 to the halogen lamp 413 is started so as to cause the halogen lamp 413 to generate heat, the inside of the spiral pipe 411 is heated, and thus the supercritical processing fluorine-containing organic solvent is evaporated, and further the temperature and the pressure of the supercritical processing fluorine-containing organic solvent are raised to reach the critical temperature and the critical pressure, respectively, so that the supercritical processing fluorine-containing organic solvent becomes a supercritical fluid.

The temperature and the pressure of the supercritical processing fluorine-containing organic solvent within the spiral pipe 411 are raised to a temperature and a pressure that enable the supercritical processing fluorine-containing organic solvent to maintain the critical pressure and the critical temperature when the supercritical processing fluorine-containing organic solvent is supplied to the processing container 3A.

The wafer W, which is covered with the second fluorine-containing organic solvent on the front surface thereof after the liquid processing has been completed, is carried into the supercritical processing unit 3 that is ready to supply the supercritical fluid of the supercritical processing fluorine-containing organic solvent in the manner as described above.

As illustrated in FIG. 3, when the wafer W is carried into the processing container 3A and the cover member 332 is closed so that the processing container 3A is in the sealed state, before the second fluorine-containing organic solvent of the surface of the wafer W is dried, the opening/closing valve 352 of the supercritical fluid supply line 351 is opened so that the supercritical fluid of the supercritical processing fluorine-containing organic solvent is supplied from the supercritical fluid supply unit 41.

When the supercritical fluid is supplied from the supercritical fluid supply unit 4A and thus the inside of the processing container 3A becomes an atmosphere of the supercritical fluid of the supercritical processing fluorine-containing organic solvent, the opening/closing valve 352 of the supercritical fluid supply line 351 is closed. The supercritical fluid supply unit 4A turns off the halogen lamp 413, discharges the fluid within the spiral pipe 411 through a depressurizing line (not illustrated), and is prepared to receive a supercritical processing fluorine-containing organic solvent for a liquid from the supercritical processing fluorine-containing organic solvent supply unit 414 in order to prepare the next supercritical fluid.

Meanwhile, the supply of the supercritical fluid to the processing container 3A from the outside is stopped and the inside of the processing container 3A is filled with the supercritical fluid of the supercritical processing fluorine-containing organic solvent and sealed. At this time, when the front surface of the wafer W within the processing container 3A is concerned, the supercritical fluid 62 of the supercritical processing fluorine-containing organic solvent is in contact with the liquid of the second fluorine-containing organic solvent which has entered the pattern. In this case, the inside of the processing container 3A is set to have a temperature of 200° C. and a pressure of 2 MPa.

When the liquid of the second fluorine-containing organic solvent and the supercritical fluid remain in contact with each other as described above, the second fluorine-containing organic solvent and the supercritical processing fluorine-containing organic solvent, which are easily mixable with each other, are mixed with each other so that the liquid within the pattern is substituted with the supercritical fluid. Consequently, the liquid of the second fluorine-containing organic solvent is removed from the front surface of the wafer W, and the atmosphere of a supercritical fluid of a mixture of the second fluorine-containing organic solvent and the supercritical processing fluorine-containing organic solvent is formed around the pattern. At this time, since the liquid of the second fluorine-containing organic solvent is removable at a relatively low temperature near the critical temperature of the supercritical processing fluorine-containing organic solvent, the fluorine-containing organic solvent is hardly decomposed so that hydrogen fluoride damaging the pattern or the like is also less produced.

In this way, when the time required for removing the liquid of the second fluorine-containing organic solvent from the front surface of the wafer W elapses, the opening/closing valve 342 of the discharge line 341 is opened and the fluorine-containing organic solvent is discharged from the inside of the processing container 3A. At this time, the heat quantity supplied from the heater 322 is adjusted such that, for example, the inside of the processing container 3A is maintained to be equal to or higher than the critical temperature of the supercritical processing fluorine-containing organic solvent. As a result, it is possible to discharge the mixture fluid in a supercritical state or a gas state without liquefying the second fluorine-containing organic solvent having a boiling point that is lower than the critical temperature of the supercritical processing fluorine-containing organic solvent, and to avoid the occurrence of pattern collapse at the time of discharging the fluid.

In this case, since the IPA is supplied to the wafer W in the state where the inside of the outer chamber 21 is set to a low-humidity $N_2$ gas atmosphere as described above, no moisture is absorbed to the IPA, and as a result, no moisture remains in the pattern of the wafer W. As such, since no moisture remains in the pattern of the wafer W placed within the outer chamber 21, pattern collapse does not occur on the wafer W during the supercritical processings of the wafer W that has been conveyed to the processing container 3A of the supercritical processing unit 3.

When the processings by the supercritical fluid are completed, the wafer W dried by removing the liquid is taken out by the second conveyance mechanism 161, stored in the FOUP 100 through the delivery section 13 and the carry-in/out section 12, and a series of processings for the wafer W is finished. In the liquid processing apparatus 1, the processings described above are successively performed on each of the wafers W stored within the FOUP 100.

As described above, according to the present exemplary embodiment, a low-humidity $N_2$ gas is continuously supplied into the outer chamber 21 from the low-humidity $N_2$ gas supply unit 206 during the supply of DHF, during the supply of DIW, during the supply of IPA, during the supply of the first fluorine-containing organic solvent, and during the supply of the second fluorine-containing organic solvent, so that the inside of the outer chamber 21 is maintained as a low-humidity $N_2$ gas atmosphere.

As described above, by maintaining the inside of the outer chamber 21 as the low-humidity $N_2$ gas atmosphere, it is possible to suppress moisture absorption into the IPA so that pattern collapse in the wafer W during the supercritical processing can be suppressed.

In addition, while the exemplary embodiment described above has illustrated an example in which IPA is supplied to the wafer W while maintaining the inside of the outer chamber 21 as the low-humidity $N_2$ gas atmosphere, another inert gas may be supplied into the outer chamber 21 in place of dry $N_2$ gas.

In addition, instead of supplying the low-humidity $N_2$ gas into the outer chamber 21, air having a dew point of −70° C. or less may be supplied into the outer chamber 21 as the low-humidity gas.

Example

Next, specific examples of the present disclosure will be described with reference to FIGS. 7 to 10.

Figure 7:
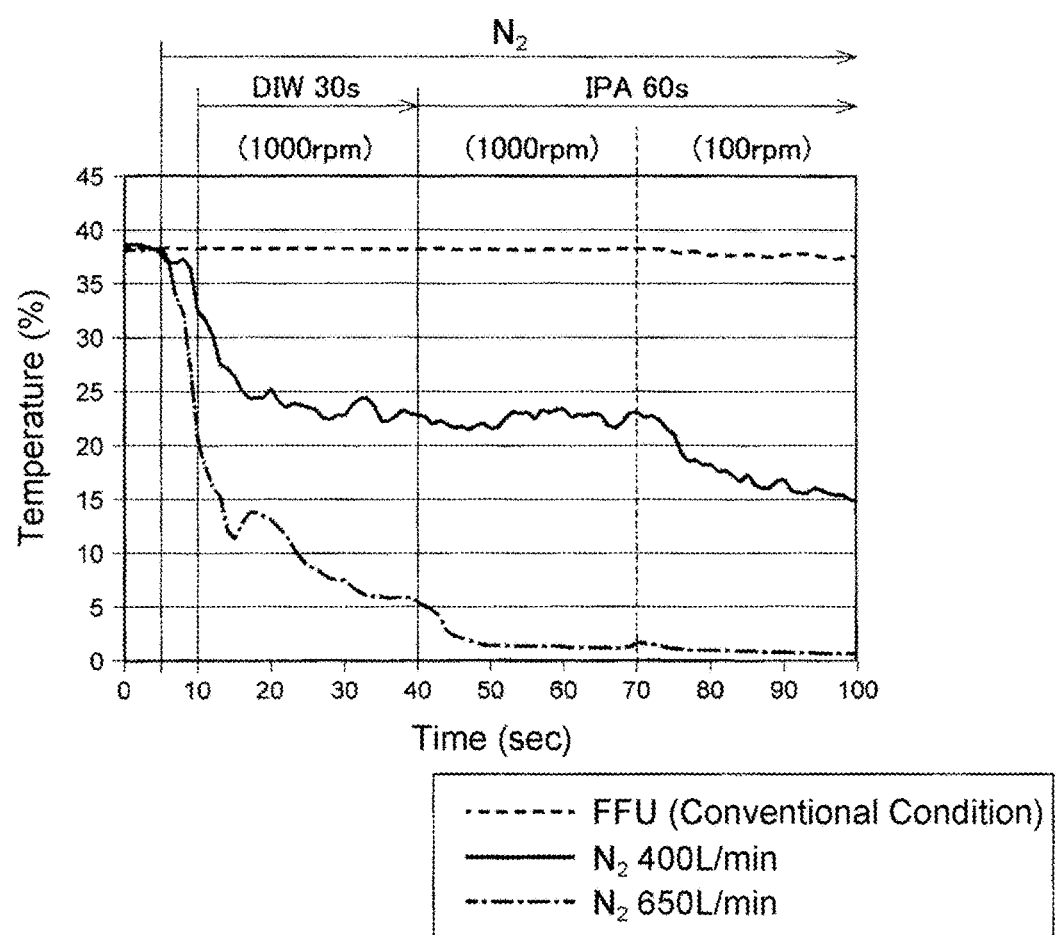
FIG. 7 is a view illustrating a change in humidity in a liquid processing unit chamber.

First, referring to FIG. 7, in the inside of the outer chamber 21, DIW was supplied for 30 seconds while rotating a wafer W (1000 rpm), and IPA was supplied for 60 seconds while rotating the wafer W. In addition, during the supply of the IPA, the number of revolutions of the wafer W was reduced from 1000 rpm to 100 rpm.

During this, when clean air was supplied into the outer chamber 21 from the FFU 205, the humidity within the outer chamber 21 became 38%. Whereas, when $N_2$ gas was supplied into the outer chamber 21 from the dry $N_2$ gas supply unit 206 by 400 L/min, the humidity within the outer chamber 21 was lowered to 15%.

It has been found that when the low-humidity $N_2$ gas is additionally supplied into the outer chamber 21 from the low-humidity $N_2$ gas supply unit 206 by 650 L/min, the humidity within the outer chamber 21 is lowered to 1%.

As illustrated in FIG. 7, the humidity within the outer chamber 21 was effectively lowered by supplying the low-humidity $N_2$ gas into the outer chamber 21 from the low-humidity $N_2$ gas supply unit 206 by 650 L/min.

Next, FIG. 8 illustrates results of pattern collapse in wafers W when the atmosphere within the outer chamber 21 was variously changed during the supply of IPA to the wafers W.

As illustrated in FIG. 8, when IPA was supplied for one minute while supplying clean air into the outer chamber 21 from the FFU 205, the humidity within the outer chamber 21 became 35% or more and pattern collapse occurred in the wafer W.

Similarly, when IPA was supplied for five minutes while supplying clean air into the outer chamber 21 from the FFU 205, the humidity within the outer chamber 21 became 35% or more and pattern collapse occurred in the wafer W.

Figure 10A:
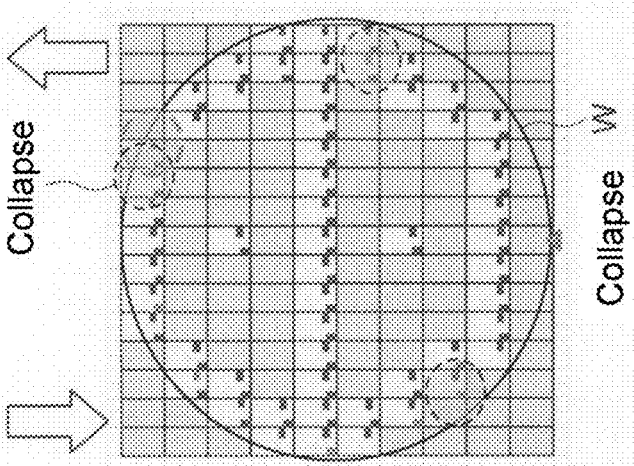
FIGS. 10A to 10C are plan views of wafers, each illustrating a result of collapse as a comparative example.
Figure 10B:
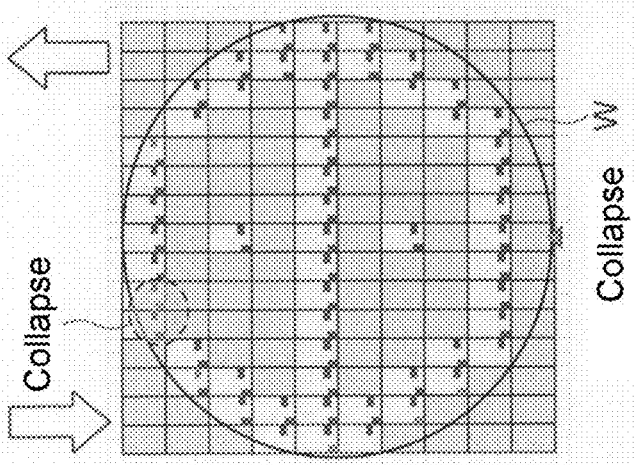
Figure 10C:
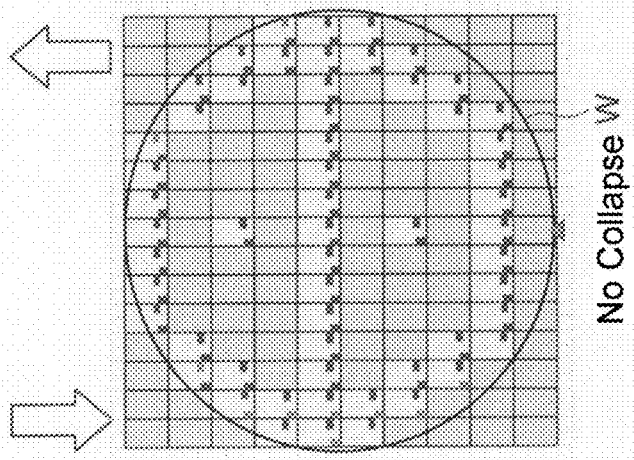

Here, examples of pattern collapse of wafers W are illustrated in FIGS. 10A to 10C. As illustrated in FIGS. 10A to 10C, when three wafers W processed under the same conditions were taken, no pattern collapse was observed in one wafer W, but pattern collapse was observed in the other two wafers W at the peripheral edges thereof.

When pattern collapse was observed in two wafers W at the peripheral edges thereof among three wafers W processed under the same conditions as described above, it is considered that pattern collapse occurred.

In addition, as illustrated in FIG. 8, when IPA was supplied for one minute while supplying low-humidity $N_2$ gas into the outer chamber 21 from the low-humidity $N_2$ gas supply unit 206 by 400 L/min, the humidity within the outer chamber 21 became 15% or more. At this time, pattern collapse scarcely occurred in the wafers W.

Further, when IPA was supplied for one minute while supplying the low-humidity $N_2$ gas into the outer chamber 21 from the low-humidity $N_2$ gas supply unit 206 by 650 L/min, the humidity within the outer chamber 21 became 1% or less. At this time, pattern collapse scarcely occurred in the wafers W.

Further, when IPA was supplied for five minutes while supplying the low-humidity $N_2$ gas into the outer chamber 21 from the low-humidity $N_2$ gas supply unit 206 by 650 L/min, the humidity within the outer chamber 21 became 1% or less. At this time, pattern collapse was scarcely occurred in the wafers W.

Here, FIGS. 9A to 9D illustrate the wafers W where no pattern collapse occurred. As illustrated in FIGS. 9A to 9D, when four wafers processed under the same conditions were taken, no pattern collapse was observed in all the four wafers W.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing method comprising:
   supplying a rinse liquid to a workpiece placed within a liquid processing unit chamber;
   supplying IPA to the workpiece placed within the liquid processing unit chamber so as to substitute moisture on the workpiece with the IPA;
   supplying, within the liquid processing unit chamber, a first fluorine-containing organic solvent to the workpiece so as to substitute the IPA on the workpiece with the first fluorine-containing organic solvent;
   supplying, within the liquid processing unit chamber, a second fluorine-containing organic solvent to the workpiece so as to substitute the first fluorine-containing organic solvent on the workpiece with the second fluorine-containing organic solvent;
   conveying the workpiece within the liquid processing unit chamber to a supercritical processing unit container; and
   supplying, within the supercritical processing unit container, a supercritical processing fluorine-containing organic solvent having a lower boiling point than the second fluorine-containing organic solvent to the workpiece,
   wherein a low-humidity gas is supplied into the liquid processing unit chamber at least during the supply of the IPA.

2. The substrate processing method of claim 1, wherein a low-humidity inert gas is supplied into the liquid processing unit chamber.

3. The substrate processing method of claim 1, wherein air having a dew point of −70° C. or less is supplied into the liquid processing unit chamber.

4. The substrate processing method of claim 1, wherein the low-humidity gas is supplied into the liquid processing unit chamber to set a humidity within the liquid processing unit chamber to 3% or less.

5. The substrate processing method of claim 1, wherein the low-humidity gas is supplied into the liquid processing unit chamber during the supply of the first fluorine-containing organic solvent, or during the supply of the first fluorine-containing organic solvent and during the supply of the second fluorine-containing organic solvent.

6. The substrate processing method of claim 1, wherein, when conveying the workpiece within the liquid processing unit chamber to the supercritical processing unit container, the workpiece is conveyed in a state where a surface of the workpiece is covered with the second fluorine-containing organic solvent.

7. The substrate processing method of claim 1, all of the first fluorine-containing organic solvent, the second fluorine-containing organic solvent, and the supercritical processing fluorine-containing organic solvent are fluorine-containing organic solvents that include fluorine atoms in hydrocarbon molecules.

8. The substrate processing method of claim 1, wherein a boiling point of the first fluorine-containing organic solvent is about 100° C.

9. The substrate processing method of claim 1, wherein a boiling point of the second fluorine-containing organic solvent is 100° C. or more.

10. The substrate processing method of claim 1, wherein an inside of the liquid processing unit chamber is set to be a temperature of 200° C. and a pressure of 2 MPa during the liquid processing.

11. The substrate processing method of claim 1, wherein the low-humidity gas is supplied into the liquid processing unit chamber at 650 L/min for 5 minutes during the supply of the IPA.

12. A non-transitory computer-readable recording medium storing a computable executable program that, when executed, causes a computer to perform a substrate processing method, the substrate processing method comprising:
   supplying a rinse liquid to a workpiece placed within a liquid processing unit chamber;
   supplying IPA to the workpiece placed within the liquid processing unit chamber so as to substitute moisture on the workpiece with the IPA;
   supplying, within the liquid processing unit chamber, a first fluorine-containing organic solvent to the workpiece so as to substitute the IPA on the workpiece with the first fluorine-containing organic solvent;
   supplying, within the liquid processing unit chamber, a second fluorine-containing organic solvent to the workpiece so as to substitute the first fluorine-containing organic solvent on the workpiece with the second fluorine-containing organic solvent;
   conveying the workpiece within the liquid processing unit chamber to a supercritical processing unit container; and
   supplying, within the supercritical processing unit container, a supercritical processing fluorine-containing organic solvent having a lower boiling point than the second fluorine-containing organic solvent to the workpiece, wherein a low-humidity gas is supplied into the liquid processing unit chamber at least during the supply of the IPA.

\* \* \* \* \*